United States Patent
Kaneko et al.

(10) Patent No.: US 7,661,866 B2
(45) Date of Patent: Feb. 16, 2010

(54) LIGHTING SYSTEM AND DISPLAY APPARATUS USING THE SAME

(75) Inventors: Hiroki Kaneko, Hitachi (JP); Toshiaki Tanaka, Kodaira (JP); Ikuo Hiyama, Hitachinaka (JP); Haruo Akahoshi, Hitachi (JP)

(73) Assignee: Hitachi Displays, Ltd., Chiba-ken (JP)

( * ) Notice: Subject to any disclaimer, the term of this patent is extended or adjusted under 35 U.S.C. 154(b) by 256 days.

(21) Appl. No.: 11/494,717

(22) Filed: Jul. 28, 2006

(65) Prior Publication Data

US 2007/0035969 A1 Feb. 15, 2007

(30) Foreign Application Priority Data

Jul. 29, 2005 (JP) ............................. 2005-219859

(51) Int. Cl.
  *F21V 29/00* (2006.01)
(52) U.S. Cl. .................... 362/612; 362/249.02; 362/294
(58) Field of Classification Search ................ 362/249, 362/800, 555, 612, 294, 373, 249.01, 249.03, 362/249.02; 257/99
See application file for complete search history.

(56) References Cited

U.S. PATENT DOCUMENTS

| | | | |
|---|---|---|---|
| 6,262,696 B1 * | 7/2001 | Seraphim et al. ............. 345/1.3 |
| 6,335,548 B1 * | 1/2002 | Roberts et al. ................ 257/98 |
| 6,500,891 B1 * | 12/2002 | Kropp et al. ................. 524/430 |
| 6,517,218 B2 * | 2/2003 | Hochstein .................... 362/294 |
| 6,821,819 B1 * | 11/2004 | Benavides et al. ........... 438/122 |
| 6,921,927 B2 * | 7/2005 | Ng et al. ........................ 257/99 |
| 6,936,855 B1 * | 8/2005 | Harrah ......................... 257/88 |
| 6,942,360 B2 * | 9/2005 | Chou et al. ................... 362/238 |
| 7,301,176 B2 * | 11/2007 | Abe et al. ...................... 257/98 |
| 7,435,997 B2 * | 10/2008 | Arndt et al. .................... 257/98 |
| 7,456,499 B2 * | 11/2008 | Loh et al. ..................... 257/710 |
| 2002/0001192 A1 * | 1/2002 | Suehiro et al. ............... 362/240 |
| 2003/0058650 A1 * | 3/2003 | Shih ........................... 362/294 |
| 2006/0027829 A1 * | 2/2006 | Wang et al. .................... 257/99 |

FOREIGN PATENT DOCUMENTS

JP 2002-16262 1/2002

* cited by examiner

*Primary Examiner*—Stephen F. Husar
*Assistant Examiner*—Peggy A. Neils
(74) *Attorney, Agent, or Firm*—Antonelli, Terry, Stout & Kraus, LLP.

(57) ABSTRACT

The present invention provides a low-cost and highly heat-radiating lighting system and a display apparatus using the same. The lighting system has a plurality of packages, each containing LEDs, lead frames and a transparent sealing material, a heat-radiating substrate and an adhesive layer adapted to bond the packages and the heat-radiating substrate. The lead frames are 0.1 mm or more in thickness. Further, the area of the surfaces of the heat-radiating substrate and the lead frames bonded together via the adhesive layer is 70 mm$^2$ per 1 mm$^2$ area of the LEDs. The display apparatus of the present invention uses the lighting system as the backlight thereof.

16 Claims, 8 Drawing Sheets

RATIO OF THE LEAD FRAME AREA TO THE LED AREA

LIGHTING SYSTEM AND DISPLAY APPARATUS USING THE SAME

CLAIM OF PRIORITY

The present application claims priority from Japanese Application JP 2005-219859 filed on Jul. 29, 2005, the content of which is hereby incorporated by reference into this application.

FIELD OF THE INVENTION

The present invention relates to a lighting system using light-emitting diodes (LEDs) and a display apparatus using the lighting system as a backlight of a non-luminescent display panel.

BACKGROUND OF THE INVENTION

A recent improvement in the LED emission efficiency has led to the replacement of lamps and fluorescent lights with LEDs as the light sources of various lighting systems. This is attributable to many features of LEDs, including their compact sizes, capability to emit multicolored beams, ease of control and low power consumption. In the lighting application requiring a high optical output, however, the optical output of a single LED is still insufficient. As a result, a plurality of LEDs are arranged for use as a lighting system.

In the case of LCD displays, for example, a lighting system is used as the backlight thereof having a plurality of packages of LEDs emitting red, green and blue beams arranged on a metal core printed circuit board, as described in [Non-Patent Document 1]. Further, as described in [Patent Document 1], a plurality of white LED packages are arranged on a flexible printed board and used in combination with a light-guiding plate or other means for use as the backlight.

[Patent Document 1]
  Japanese Patent Application Laid-Open Publication No. 2002-16262

[Non-Patent Document 1]
  SID03 Digest, pp. 1262-1265 (2003)

SUMMARY OF THE INVENTION

In the case where a plurality of LED packages are arranged on a metal core printed circuit board as described in [Non-Patent Document 1], however, such a metal core printed circuit board is expensive.

On the other hand, the arrangement of a plurality of LEDs on a flexible printed board, as described in [Patent Document 1], is inexpensive due to the use of a flexible printed board. This arrangement, however, has a problem with heat radiation capability and particularly cannot readily dissipate heat around the packages.

It is an object of the present invention to provide a low-cost and highly heat-dissipating LED lighting system and a display apparatus using the same.

In order to solve the abovementioned problems, the present invention provides a lighting system having a substrate, an adhesive layer disposed on the substrate, lead frames disposed on the adhesive layer and LEDs connected to the lead frames. In this lighting system, the ratio of the contact area between the lead frames and the adhesive layer relative to that between the LEDs and the lead frames is 500 or more. Highly effective heat radiation is achieved if the ratio of the areas described above is 780 or more. Further, a more effective heat-radiating structure can be realized by providing the lighting system having a substrate, an adhesive layer disposed on the substrate, lead frames disposed on the adhesive layer and LEDs connected to the lead frames if the thermal conductivity of the adhesive layer is 1.7 W/m-K or more and if the ratio of the contact area between the lead frames and the adhesive layer relative to that between the LEDs and the lead frames is 300 or more. Further, more effective heat radiation can be achieved if the ratio of the areas is 500 or more and if the thermal conductivity of the adhesive layer is 5 W/m-K or more.

Another lighting system of the present invention is provided with a plurality of packages, each having the LEDs, the lead frames and a transparent sealing material. In this lighting system, the packages and the substrate are bonded together by the adhesive layer. Still another lighting system of the present invention has a unitary structure in which the plurality of packages share a single continuous lead frame.

In another configuration of the present invention, a lighting system has a substrate, an adhesive layer disposed on the substrate, lead frames disposed on the adhesive layer and LEDs connected to the lead frames. The configuration of this lighting system is characterized in that the LEDs are connected to the lead frames by wire bonding and that the area of the lead frame on which the LED is mounted is larger than that of the lead frame on which no LED is mounted. Further, the adhesive layer is made up of a rigid film with an adhesive film disposed on both sides of the rigid film.

In order to accomplish the other object of the present invention, a display apparatus of the present invention has a backlight having a plurality of lighting systems of any of the above configurations. The display apparatus also has a group of optical members adapted to control the uniformity and directivity of the beam from the backlight, and a non-luminescent display panel made up of a plurality of pixels and adapted to control the reflection or transmission of the beam for each of the pixels.

The backlight has light-guiding elements adapted to allow the beams from the lighting systems to enter the backlight from the incidence surface on the side thereof and leave the beams from the top surface thereof. The backlight has the plurality of sets of lighting system and light-guiding element which are arranged in a tiled fashion.

The above configurations make it possible to realize a low-cost and highly heat-radiating lighting system and a display apparatus using the same.

DETAILED DESCRIPTION OF THE PREFERRED EMBODIMENTS

A detailed description will be made below of the embodiments of a lighting system, a manufacturing method of the same and a display apparatus using the same according to the present invention with reference to the accompanying drawings.

First Embodiment

Figure 1A:
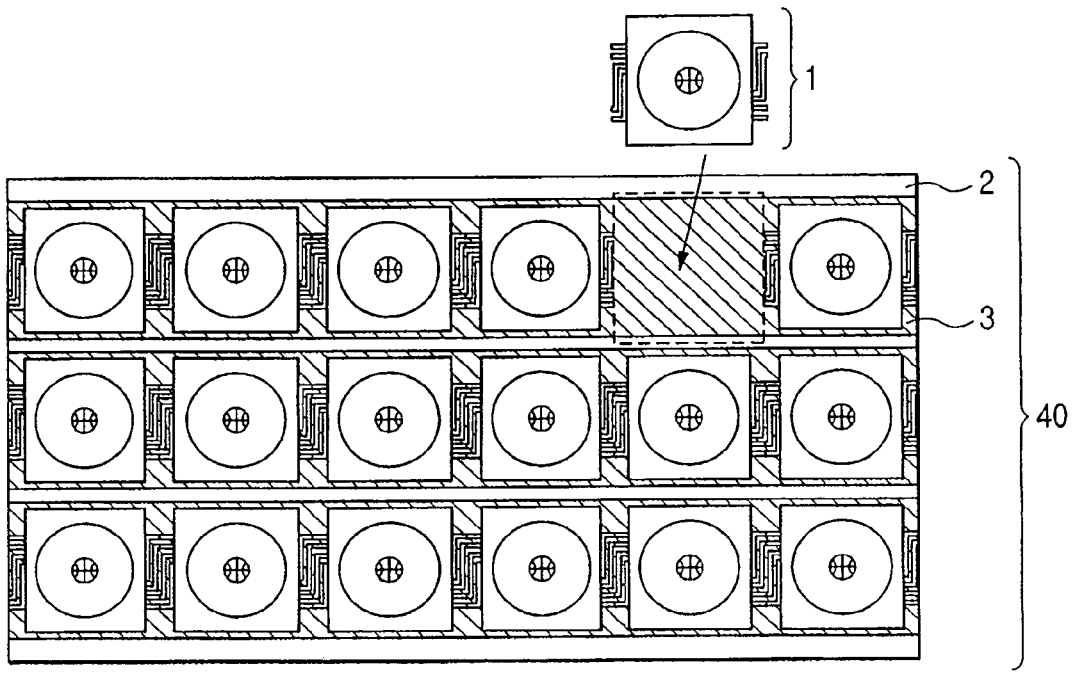
FIGS. 1A and 1B are a top view and electrical circuit diagram describing a first embodiment of a lighting system of the present invention.
Figure 1B:
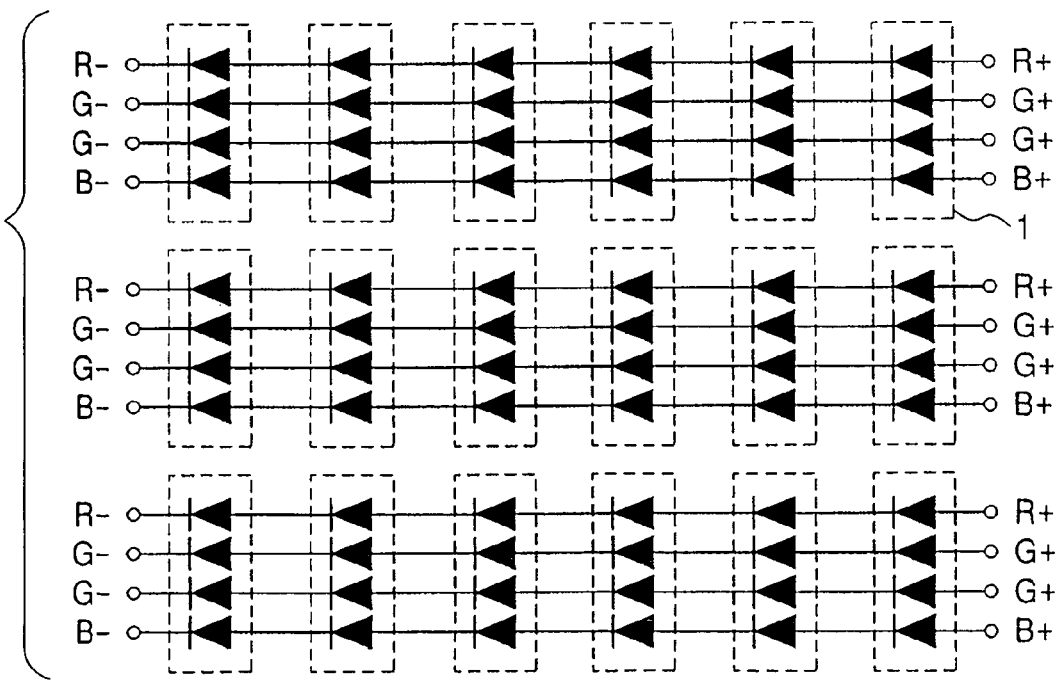

FIGS. 1A and 1B are explanatory views of a first embodiment of a lighting system of the present invention. FIG. 1A shows a top view, and FIG. 1B an electrical circuit diagram. A lighting system 40 of the present invention is made up of a plurality of packages 1, a heat-radiating substrate 2 and an adhesive layer 3 which bonds the packages 1 and the heat-radiating substrate 2 together.

Figure 2A:
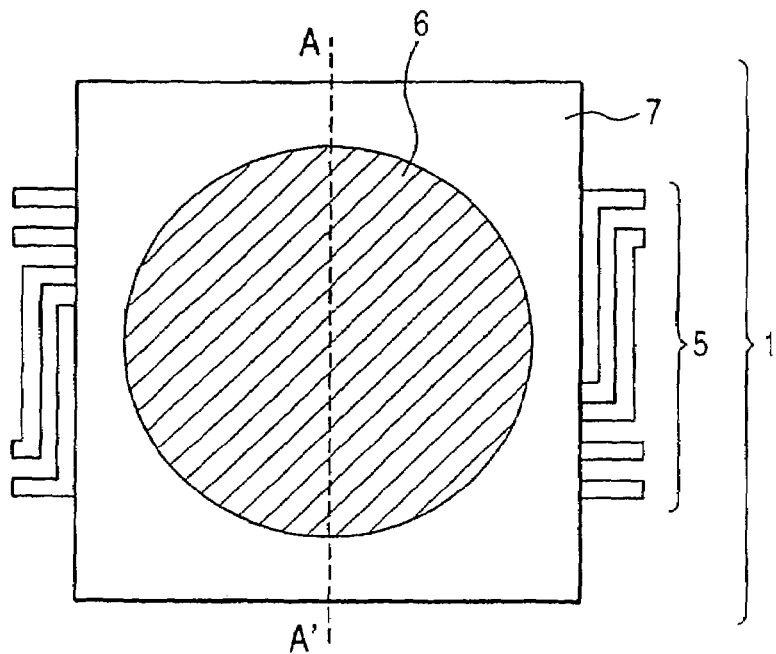
FIGS. 2A, 2B and 2C are respectively top views and a sectional view describing a package of the first embodiment of the lighting system of the present invention.
Figure 2B:
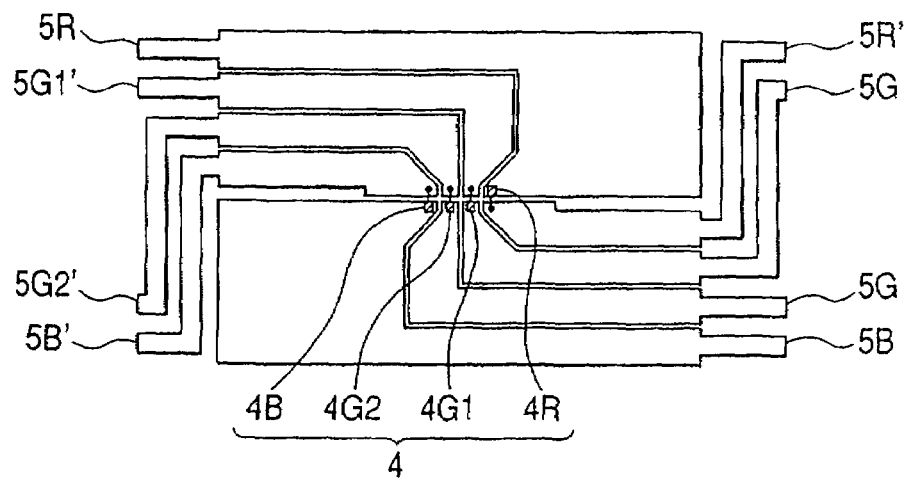
Figure 2C:
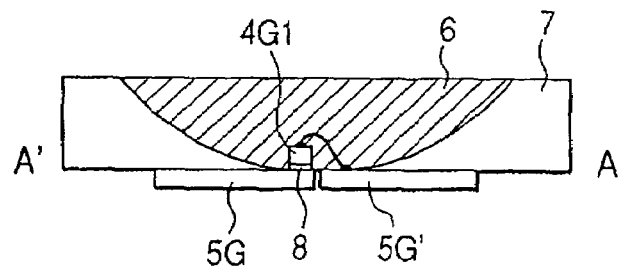

A detailed description of the packages 1 will be made with reference to FIGS. 2A, 2B and 2C. FIGS. 2A and 2B show top views, and FIG. 2C shows a sectional view of FIG. 2A taken along the line A-A'. The package 1 is made up of lead frames 5, a transparent sealing material 6, a reflector mold 7 and LEDs 4R, 4G1, 4G2 and 4B. The LEDs 4R, 4G1, 4G2 and 4B are die-bonded onto lead frames 5R, 5G1, 5G2 and 5B. The LEDs 4R, 4G1, 4G2 and 4B are electrically connected by wires from the top electrodes thereof, respectively, to opposed lead frames 5R', 5G1', 5G2' and 5B'.

The lighting system 40 in FIG. 1A is realized by electrically connecting the lead frames 5 of the adjacent packages 1 in FIG. 2A and has an electrical circuit configuration as shown in FIG. 1B. The LEDs of each of the packages 1 can be caused to emit beams by applying a voltage to the LEDs in such a manner that a current flows across the electrical circuit in the forward direction (from right to left in the figure). The beams from the LEDs 4R, 4G1, 4G2 and 4B transmit through the transparent sealing material 6 to be emitted externally, thus allowing the lighting system 40 to function as such. A part of the beams is reflected by the reflector mold 7 first before being emitted externally. In the present embodiment, the four LEDs or the LEDs 4R, 4G1, 4G2 and 4B are provided which respectively emit red, green, green and blue beams. Here, a beam of arbitrary color can be produced if the intensities of the red, green, green and blue beams are adjusted by adjusting the drive currents and emission times thereof in mixing the colors. In the present embodiment, two green LEDs are provided in the package 1 in consideration of the beam emission efficiency of the LEDs. This arrangement is intended particularly to make up for the lack of light intensity of the green LED which has the lowest light intensity among all the LEDs in the case of producing a white beam by mixing red, green and blue which are the primary colors of light.

Figure 3:
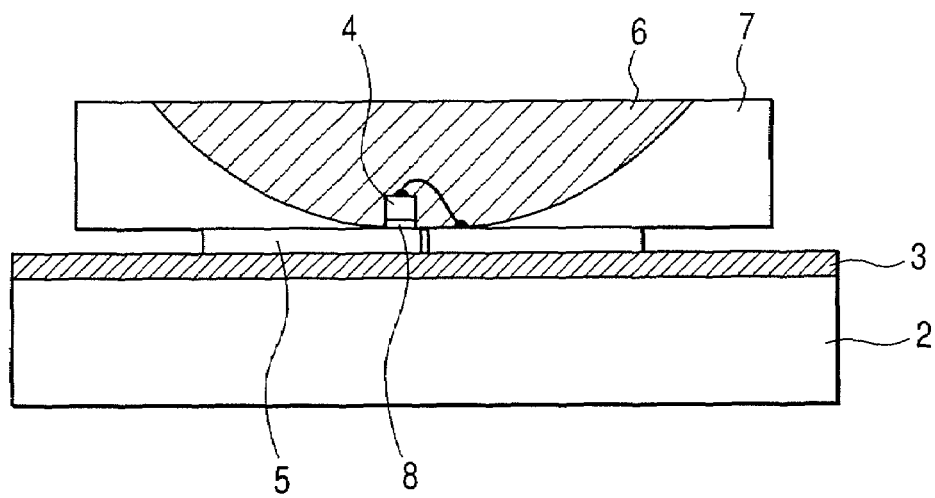
FIG. 3 is a sectional view describing the first embodiment of the lighting system of the present invention.

Incidentally, a large percentage of power supplied to the LEDs is consumed as heat rather than as light. Further, the emission efficiency of the LEDs declines as the temperature thereof rises. Because of this property, the heat radiation capability is essential to maintain and further enhance the light intensity. In the present invention, the majority of heat generated by the LEDs 4 conducts to the lead frames 5 via a die-bonded portion 8, as shown in FIG. 3. Here, the lead frames 5 of the present invention are 0.1 mm or more in thickness. This thickness ensures effective spread of heat in the direction of the surface of the lead frames 5 (horizontal direction in the figure). The heat which spreads to the lead frames 5 is transferred to the heat-radiating substrate 2 via the adhesive layer 3. The heat reaching the heat-radiating substrate 2 is released into the atmosphere from the rear surface thereof.

Here, when a material such as polyimide, PET or polyamide is used as the adhesive layer 3, the thermal conductivity is low or about 0.16 W/m-K. On the other hand, even in the case of the silicon-based adhesive layer 3 with a relatively high thermal conductivity as an adhesive layer or the epoxy-based adhesive layer mixed with a filler, the thermal conductivity is only about 1.7 W/m-K. Even the adhesive layer 3 having an even higher thermal conductivity for improved heat radiation capability offers the highest achievable thermal conductivity of approximately 5.0 W/m-K. This thermal conductivity is roughly two orders of magnitude smaller as compared to copper, aluminum and other metals used for the lead frames 5 and the heat-radiating substrate 2 which have thermal conductivities of 400 to 200 W/m-K. Therefore, how to dissipate heat from the lead frames 5 to the heat-radiating substrate 2 via the adhesive layer 3 is an important issue. The present invention effectively spreads the heat generated by the LEDs 4 using the lead frames 5 having a high thermal conductivity. Further, the present invention offers a large contact area between the lead frames 5 and the heat-radiating substrate 2 via the adhesive layer 3, thus ensuring effective heat radiation. The following is a description of a high heat radiation effect offered by the present invention irrespective of the material used as the adhesive layer 3.

It can be assumed that when a power of about 1 W to 3 W is applied normally to 1 mm$^2$ of area on the top or bottom surface of the LEDs 4, nearly all the power applied conducts to the lead frames 5 as heat.

Figure 4:
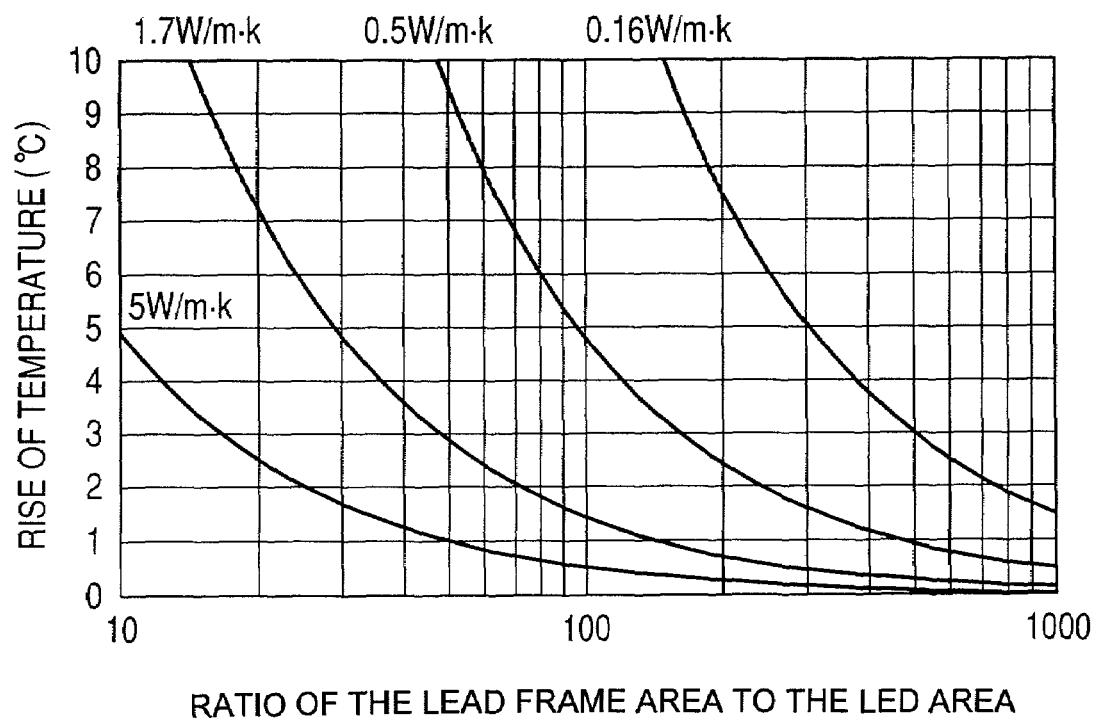
FIG. 4 is a view illustrating the relationship between the lead frame area and the rise of temperature of the lighting system of the present invention.

FIG. 4 shows the relationship between the ratio of the lead frame area to the LED area and the rise of temperature. Here, the LED area represents the contact area between the LEDs 4 and the lead frames 5 in FIG. 3, and the lead frame area represents the contact area between the lead frames 5 and the adhesive layer 3 in the same figure.

In FIG. 4, the graph is plotted assuming that the adhesive layer 3 beneath the lead frames 5 is 0.8 mm in thickness and that the thermal conductivity thereof is respectively 0.16 W/m-K, 0.5 W/m-K, 1.7 W/m-K and 5.0 W/m-K.

In the normal backlight configuration using the adhesive layer 3 having a thermal conductivity of about 0.16 W/m-K, it suffices to keep the temperature rise to 3° C. or less. This goal can be achieved by ensuring that the ratio of the areas is 500 or more. The ratio of the areas of 780 or more is more preferable because the temperature rise can be kept to 2° C. or less.

On the other hand, if a highly heat-radiating structure is required, the temperature rise can be kept to 0.5° C. or less by using the adhesive layer having a thermal conductivity of 1.7

W/m-K or more and providing the ratio of the areas of 300 or more. Further, the temperature rise can be kept to 0.3° C. or less if the adhesive layer has a thermal conductivity of 1.7 W/m-K or more and if the ratio of the areas is 500 or more. The same can be achieved if the adhesive layer has a thermal conductivity of 5 W/m-K or more and if the ratio of the areas is 250 or more. Thus, the present embodiment achieves a heat-radiating structure required of the backlight by having a significantly larger-than-normal ratio of the lead frame area to the LED area, thus.

It should be noted that when a power of about 1 W to 3 W is supplied to the LEDs 4, a heat-radiating structure can be achieved using the aforementioned ratios of the areas. An excellent heat-radiating structure can be achieved using the aforementioned ratios of the areas particularly if the LED chip is supplied with a power of 3 W/mm$^2$ or less.

Next, a description will be made of improving the heat radiation by changing the lead frame shape in addition to specifying the ratio of the areas. If the LEDs are wire-bonded to the lead frame as shown in FIG. 3, a large percentage of the heat generated by the LEDs 4 is radiated from the lead frames on which the LEDs are mounted. Consequently, an improved heat-radiating structure can be achieved by ensuring that the lead frames with the LEDs are larger in area than the lead frames without the LEDs.

In FIG. 2B, reference numerals 4R, 4G1, 4G2 and 4B respectively represent the red, green, green and blue LEDs. Here, heat can be more effectively radiated if the areas of the lead frames 5R, 5G and 5B, each with one of the LEDs, are larger than the lead frames 5R', 5G1', 5G2' and 5B', none of which has any of the LEDs. That is, a more effective heat-radiating structure can be achieved without changing the lead frame area in the package as a whole.

Further, when four LEDs respectively emitting red, green, green and blue beams are mounted to the package 1 as in the present embodiment, the lead frames 5R and 5B can each have a large area if the LEDs 4R and 4B, each of which is the only LED of that color, are disposed on the outside. That is, if the LEDs 4R and 4B are mounted to the sides opposite to the LED-mounted sides of the lead frames, the lead frame areas can be effectively assigned in the package. This structure offers further enhanced heat radiation capability and allows all the colors to be emitted in a well-balanced fashion when producing a white beam by mixing the colors, thus providing a bright lighting system.

Next, a description will be made of important members among those in the lighting system of the present invention.

Figure 5A:
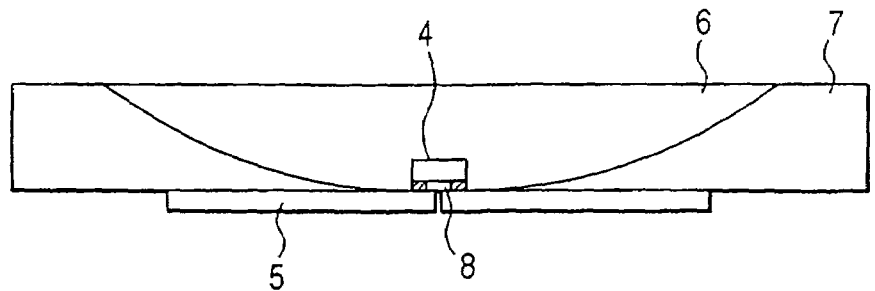
FIGS. 5A and 5B are sectional views describing how an LED is mounted in the first embodiment of the lighting system of the present invention.
Figure 5B:
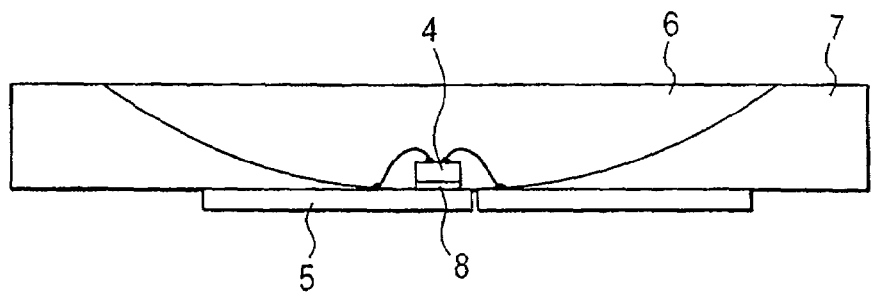

The emission colors of the LEDs 4 can be changed by changing the composition, structure, manufacturing method and other factors of the LED semiconductor layers. The arbitrary emission colors can be selected from among those in the visible radiation region. Further, if illuminants are disposed around the LEDs, the color beams emitted by the LEDs and the illuminants can be mixed. This arrangement makes it possible to emit a white beam, for example, by mixing the blue beam of the LED and the yellow beam of the illuminant or mixing the ultraviolet beam of the LED and the red, green and blue beams of the illuminants. The beam colors can be selected and combined arbitrarily according to the intended application of the lighting system. On the other hand, the LEDs 4 are mounted differently depending on the arrangement of an anode and cathode which are the two electrodes thereof. In addition to the arrangement having one of the electrodes on the top surface and the other on the bottom surface of the LED 4 as shown in FIG. 3, the anode and cathode may be both provided on the bottom surface as shown in FIG. 5A. Alternatively, the anode and cathode may be both provided on the top surface as shown in FIG. 5B. Both of these arrangements can also be used. Further, when the LEDs 4 having both the anode and cathode on the bottom surface thereof as shown in FIG. 5A are mounted to the lead frames 5, heat can be radiated more effectively if the anode or cathode, whichever has a larger area, is assigned the larger lead frame 5. While the present invention will be described below primarily with reference to the arrangement in FIG. 3 in this and other embodiments, the LEDs having either of the arrangements shown in FIGS. 5A and 5B may also be used, unless otherwise noted.

The lead frames 5 are formed by stamping or etching from a flat strip of metal having a thickness of about 0.1 mm to 3 mm or a contoured strip of metal having thick and thin portions. The lead frames 5 are made of a material such as copper, an alloy containing copper as a principal component, iron-nickel alloy or the like. Because the majority of power supplied to the LEDs turns into heat and this heat reduces the emission efficiency, it is preferable to use copper which has a high thermal conductivity or an alloy containing copper as a principal component in terms of emission efficiency and reliability. Further, improved mounting reliability can be achieved by silver- or gold-plating the surfaces of the lead frames 5. Moreover, silver- or gold-plating reflects the beam from the LEDs 4 entering the lead frames 5 at a high efficiency, thus contributing to improved light utilization efficiency of the lighting system. There are several types of plating available, including total surface plating, line plating and spot plating. All the types of plating are acceptable. In the following description of the present invention, no distinction will be made whether the lead frame surfaces are plated in this and other embodiments, unless otherwise noted.

Various transparent resins and glass can be used as the transparent sealing material 6. It is preferable that the material used having heat- and light-resistance, high transmittance, and low moisture permeability can be formed by injection molding, transfer molding, potting, various printing methods or other methods. Further, if the transparent sealing material 6 is shaped into the form of a convex or concave lens, the beam from the LEDs can be effectively collected or scattered. Moreover, if beads having a different refraction index are mixed into the transparent sealing material, an improved diffusibility, uniformity and light extraction efficiency at which light from the LEDs is extracted can be attained. Two types of the transparent sealing materials, one containing diffuser beads and the other not containing such beads, may be stacked. While the present invention will be described below with reference to the use of a single layer of the transparent sealing material in this and other embodiments, either of the aforementioned transparent sealing materials may also be used.

Various types of resins can be used as the reflector mold 7. The reflector mold 7 can be formed by methods including injection molding and transfer molding. Further, a ceramic may also be used as the reflector mold 7. It is preferable that the material used have high reflectance in the entire visible radiation region, low moisture permeability, and heat- and light-resistance. Still further, the material with a small shrinkage factor at the time of molding is preferable particularly if the reflector mold 7 is molded integrally with the lead frames 5. Moreover, a metal film may be deposited on the mold surface for higher reflectance by a method such as plating, vapor deposition, sputtering or printing. In the present invention, the reflector mold 7 allows the beam emitted by the LEDs 4 to be extracted effectively from the front of the lighting system. However, the reflector mold 7 is not necessarily required since the beam may need to be spread out into the surrounding area depending on the application. While the present invention will be described below with reference to the lighting system having the reflector mold 7 in this and other embodiments, it is needless to say that the lighting system functions as such without the reflector mold 7.

A metal having a high thermal conductivity or a ceramic can be used as the heat-radiating substrate 2. A metal such as copper, aluminum, an alloy containing copper or aluminum as a principal component, aluminum nitride, silicon nitride or alumina can be used. A heatsink, heat pipe, fan or other heat removal means may be provided on the rear surface of the heat-radiating substrate 2 to actively accelerate heat radiation.

The adhesive layer 3 is required to not only bond the lead frames 5 and the heat-radiating substrate 2 and transfer heat from the lead frames 5 to the heat-radiating substrate 2 but also be electrically insulating if the heat-radiating substrate 2 is conductive as when made of a metal. Any of various types of adhesives and adhesive sheets which meet these requirements can be used as the adhesive layer 3. An adhesive containing a filler may also be used to provide an improved thermal conductivity. Further, the adhesive layer 3 need not be a single layer. Therefore, the adhesive layer 3 may be made up of a film with an adhesive or adhesive sheet stacked on the front or rear surface thereof. An insulating and heat-resistant film can be used such as a polyimide, PET or polyamide film. As the adhesive or adhesive sheet, on the other hand, an adhesive and heat-resistant material can be used, including epoxy-, acryl- or silicon-based material or a mixture thereof.

Second Embodiment

Figure 6A:
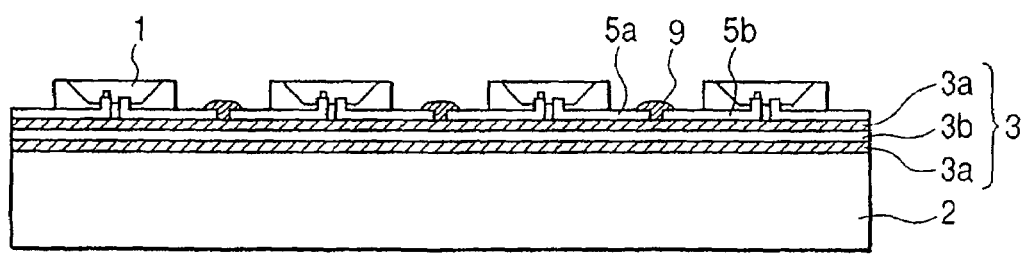
FIGS. 6A and 6B are sectional views describing a second embodiment of the lighting system of the present invention.
Figure 6B:
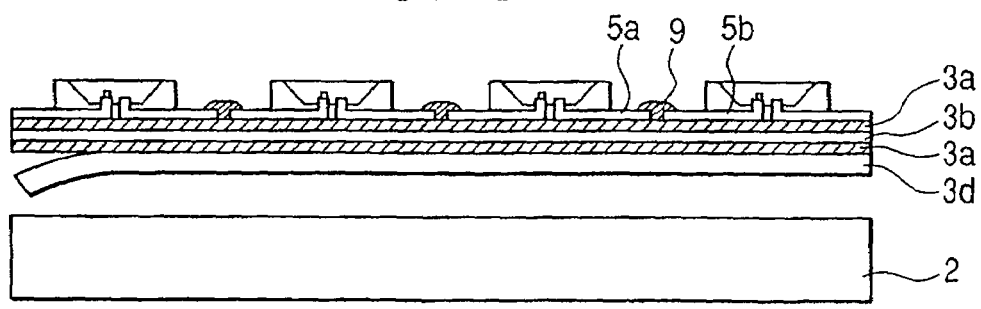

FIGS. 6A and 6B show sectional views describing another embodiment of the present invention. The present embodiment is characterized in that the adhesive layer 3 has a stacked structure made up of a rigid film 3b and adhesive films 3a disposed outside thereof. This structure provides the adhesive layer 3 with a proper rigidity and adhesive capability and allows the lead frame package 1 to be fastened to the adhesive layer 3 even in the manufacturing process. This makes it possible to use a manufacturing process which, as shown in FIG. 6B, fastens the package 1 to the adhesive layer 3, connects the adjacent lead frames 5 with a solder 9, removes a protective film 3d provided in advance on the rear surface of the adhesive layer 3 and bonds the heat-radiating substrate 2 to the adhesive layer 3.

Figure 7A:
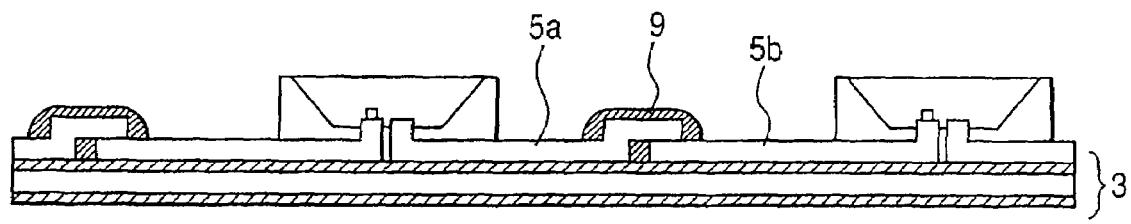
FIGS. 7A, 7B and 7C are sectional views describing the second embodiment of the lighting system of the present invention.
Figure 7B:
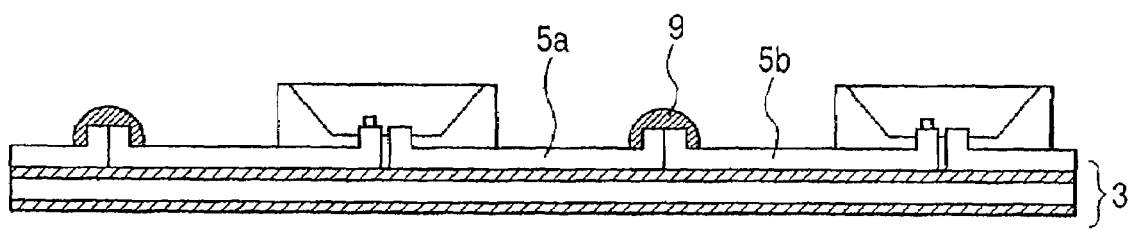
Figure 7C:
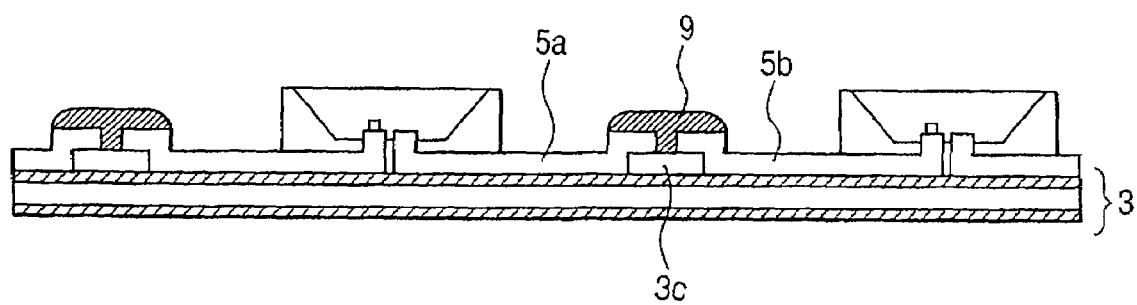

Here, the connection structure between the adjacent lead frames is described. The connection structure shown in FIG. 6A is formed to connect flat lead frames 5a and 5b with unworked ends via the solder 9. In the connection structure shown in FIG. 7A, on the other hand, one end of the lead frame 5a is lifted up about as much as the thickness of the lead frame 5b by bending or other means such that the ends of the lead frames 5a and 5b are stacked one on top of another. This structure ensures excellent electrical connection due to the stacked portion of the originally adjacent lead frames 5a and 5b even if the package mounting accuracy is somewhat poor. Further, both ends of the lead frames 5a and 5b may be lifted up by bending or other means as shown in FIG. 7B. If both ends of the lead frames are lifted up, these ends may be joined by soldering as shown in FIG. 7B. Alternatively, the convex portions at the ends of the lead frames may be joined by spot welding, ultrasonic welding, or mechanical crimping which do not use solder. Still further, as shown in the connection structure of FIG. 7C, the adhesive layer 3 having a wiring 3c formed in advance on the topmost portion thereof is used so as to ensure that the ends of the lead frames 5a and 5b are stacked on top of the wiring 3c. This structure ensures excellent electrical connection thanks to the portions of the lead frames 5a and 5b stacked on top of the wiring 3c even if the package mounting accuracy is somewhat poor. It should be noted that the ends of the lead frames 5 are soldered together on the wiring 3c because of their proximity to each other.

In addition to the effects obtained by the aforementioned embodiments, the present embodiment of the invention provides additional advantages. One of the advantages is that the manufacturing process can be used which bonds the package 1 onto the adhesive layer 3 in advance and electrically connects the lead frames of the adjacent packages on the film. Another advantage is ease of handling during manufacturing because the adhesive layer 3 can be readily bonded to the heat-radiating substrate 2 by peeling off the protective film 3d. Still another advantage is that even if the heat-radiating substrate 2 has recesses or bumps rather than being flat or even if it is curved or bent, the adhesive layer 3 can be flexibly bent to suit the shape of the heat-radiating substrate 2 and affixed thereto.

Third Embodiment

Figure 8:
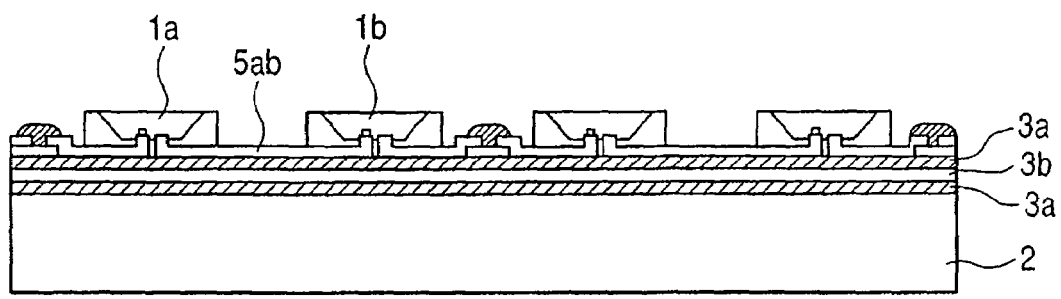
FIG. 8 is a sectional view describing a third embodiment of the lighting system of the present invention.

FIG. 8 shows a sectional view describing still another embodiment of the lighting system of the present invention. The present embodiment has a unitary structure in which a plurality of packages (e.g., 1a and 1b in FIG. 8) share a continuous lead frame 5ab. In addition to the effects described in the aforementioned embodiments, the present embodiment of the invention offers an additional advantage. That is, the lead frame 5ab of the unitary portion requires no new electrical connection using soldering or other means, thus ensuring reduced number of mounting process steps. Further, the number of the packages 1 making up the unit is not limited to two. Instead, the unit may be made up of a whole row of the packages 1 required for the lighting system. Still further, the units having different numbers of the packages 1 may be combined. While the present invention will be described below with reference to a non-unitary structure rather than a unitary structure, the same effect can be obtained by replacing the plurality of packages with a single unit.

Fourth Embodiment

Figure 9A:
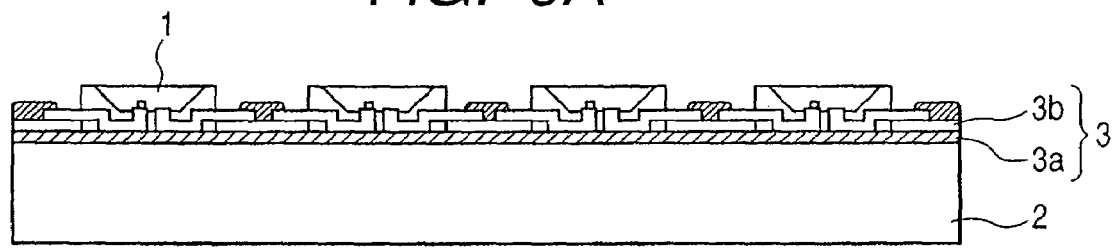
FIGS. 9A and 9B are respectively a sectional view describing a fourth embodiment of the lighting system of the present invention and a top view of an adhesive layer.
Figure 9B:
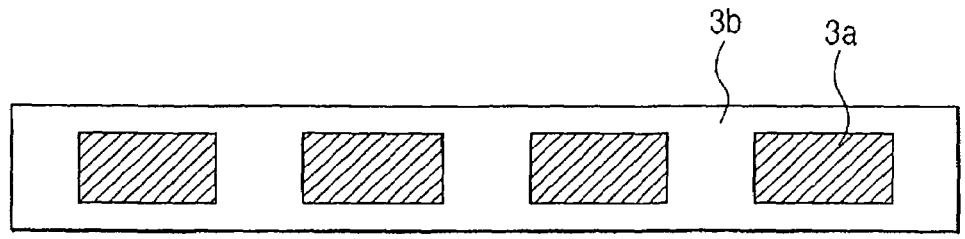

FIGS. 9A and 9B are explanatory views of still another embodiment of the lighting system of the present invention. FIGS. 9A and 9B show a sectional view of the embodiment and a top view of the adhesive layer 3, respectively. In the present embodiment, the film 3b making up the adhesive layer 3 has holes designed to match the shape of the reflector molds 7. The packages 1 are placed in the holes and bonded. In addition to the effects obtained by the aforementioned embodiments, the present embodiment of the invention provides an additional advantage. That is, the packages 1 is bonded to the heat-radiating substrate 2 only via an adhesive layer 3a, thus achieving more excellent heat radiation capability. On the other hand, if the packages 1 do not have the reflector mold 7 (not shown), the same effect can be obtained by providing the film 3b with holes to match the shape of the transparent sealing material.

Fifth Embodiment

Figure 10A:
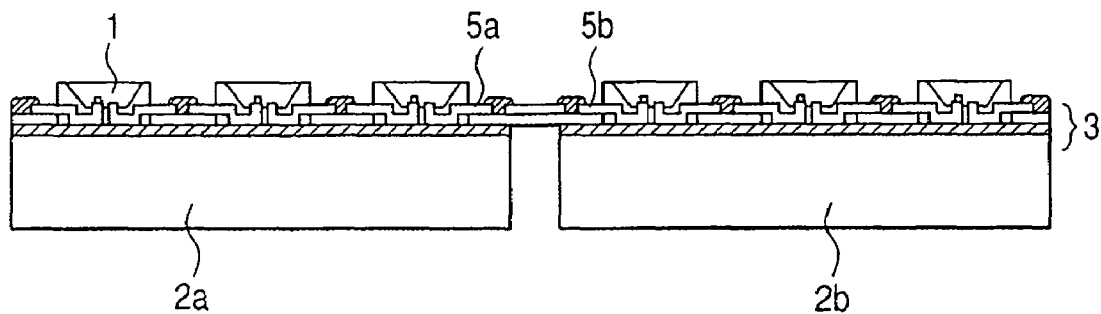
FIGS. 10A and 10B are respectively a sectional view describing a fifth embodiment of the lighting system of the present invention and a top view of the adhesive layer.
Figure 10B:
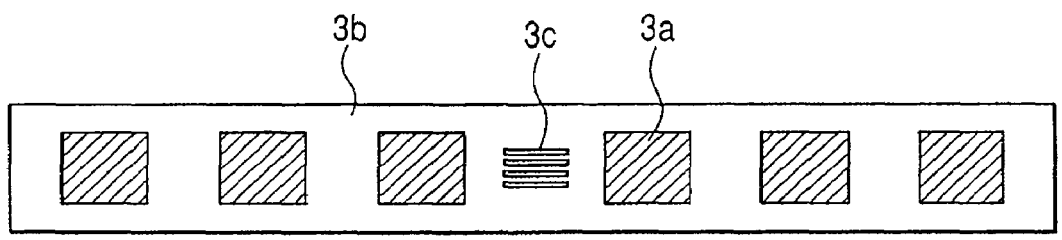

FIGS. 10A and 10B are explanatory views of still another embodiment of the lighting system of the present invention. FIGS. 10A and 10B show a sectional view of the embodiment and a top view of the adhesive layer 3, respectively. The plurality of packages 1 are provided on each of two heat-radiating substrates 2a and 2b. In the present embodiment, the heat-radiating substrate is separated into two pieces. The wiring 3c adapted to electrically connect the lead frames 5a and 5b at each end of the heat-radiating substrates 2a and 2b is provided on the film 3b which makes up the adhesive layer 3. In addition to the effects obtained by the aforementioned embodiments, the present embodiment of the invention provides an additional advantage. That is, if the lighting system has the plurality of substrates, the substrates can be electrically connected together without providing any separate connector or wiring. Further, the present embodiment provides still another advantage. That is, if the heat-radiating substrates 2a and 2b are arranged in the shape of a dog leg bent to the left side or up (not shown), the substrates can be electrically connected together by bending the adhesive layer 3 without providing any separate connector or wiring.

Sixth Embodiment

Figure 11:
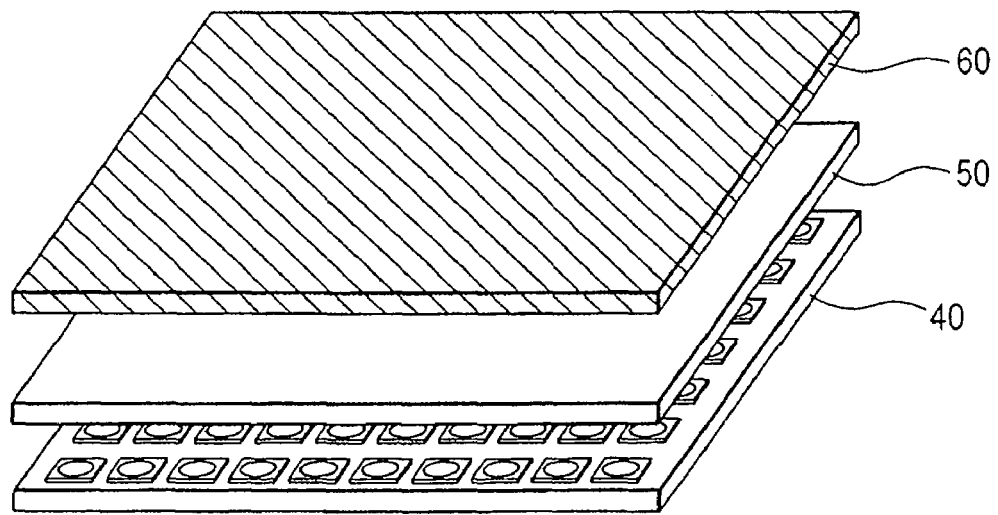
FIG. 11 is a perspective view describing a sixth embodiment of a display apparatus of the present invention.

FIG. 11 is a perspective view describing an embodiment of the display apparatus of the present invention. The display apparatus of the present invention has a lighting system 40 which is provided with the one or the plurality of lighting systems described in the aforementioned embodiments and whose wiring portion and heat-radiating substrate are covered with a reflecting sheet having a high reflectance. The display apparatus also has a group of optical members 50 adapted to render uniform the beam emitted by the lighting system 40 and control the directivity thereof, and a non-luminescent display panel 60. The non-luminescent display panel 60 can display arbitrary images and text by arbitrarily controlling the transmission or blocking of the beam from the lighting system 40 provided on the rear surface for each pixel. The non-luminescent display panel 60 of the present invention has several display modes, namely, liquid crystal display mode, electrophoresis display mode, electrochromic display mode, electronic particulate display mode and an additional transmissive display mode in which the panel does not itself emit light, all of which can be used. On the other hand, the group of optical members 50 uses diffusing, reflecting and light-guiding plates, prism sheet and polarizing, reflecting and diffusing sheets and other members alone or in combination to achieve an arbitrary directivity and beam uniformity.

The display apparatus of the present invention uses the plurality of lighting systems described in the aforementioned embodiments as the backlight thereof, thus making it possible to build a highly heat-radiating and highly bright or low power consuming backlight and achieving a highly bright or low power consuming display apparatus. Further, the backlight can be manufactured at low cost because of ease of handling, thus contributing to a reduced cost of the display apparatus as a whole. Still further, the LEDs have faster ON/OFF response time as compared to conventional backlights using fluorescent tubes, thus contributing to improved moving picture quality of the display apparatus. Still further, the display apparatus particularly made up of the backlight using the LEDs emitting red, green and blue beams can provide a more brilliant display with a wider color reproduction range as compared to conventional backlights using fluorescent tubes. The LEDs have an additional advantage in that they are environmentally friendly because they do not contain mercury.

Seventh Embodiment

Figure 12:
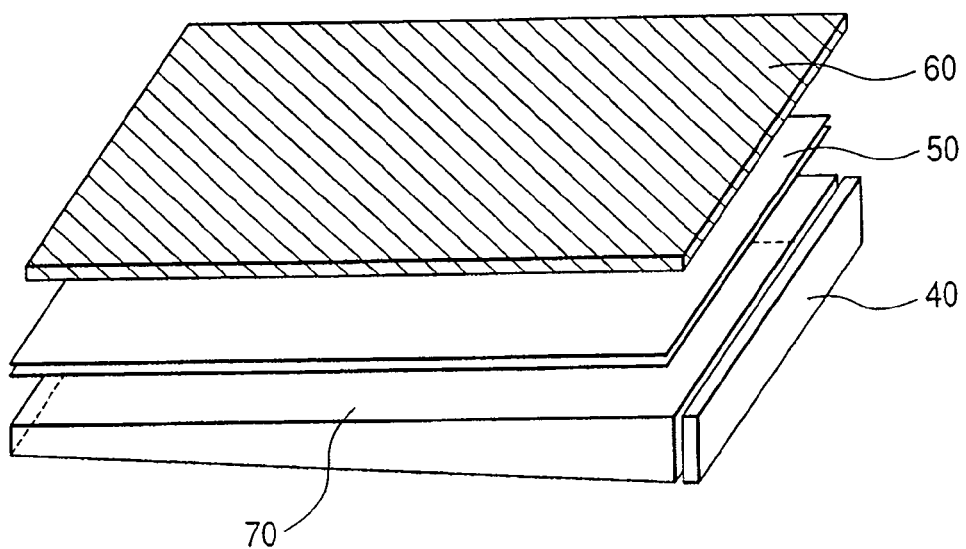
FIG. 12 is a perspective view describing a seventh embodiment of the display apparatus of the present invention.

FIG. 12 is a perspective view describing another embodiment of the display apparatus of the present invention. In the present embodiment, the lighting system 40 of the present invention is disposed on the side of a light-guiding plate 70 so as to allow the beam to be incident on the light-guiding plate 70. A sheet having high reflectance is disposed on the rear surface of the light-guiding plate 70, causing the beam to be reflected a plurality of times before being emitted from the front surface thereof. Further, the group of various optical members 50, such as prism sheet, polarizing and reflecting plates and diffusing sheet, are dispose alone or in combination on top of the light-guiding plate 70. The non-luminescent display panel 60 is disposed on top of the group of optical members 50. In the present invention, the same effects as the aforementioned embodiments can be achieved. Further, particularly in the case of manufacturing a display apparatus having a small screen size, the display apparatus can be suitably made thinner using the light-guiding plates.

Eighth Embodiment

Figure 13:
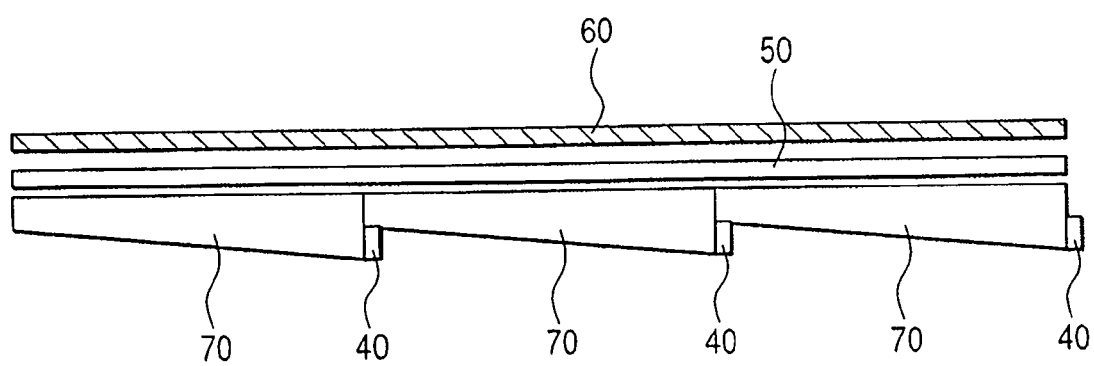
FIG. 13 is a perspective view describing an eighth embodiment of the display apparatus of the present invention.

FIG. 13 is a sectional view describing still another embodiment of the display apparatus of the present invention. In the present embodiment, the lighting systems 40 are each disposed on the side of one of the plurality of wedge-shaped light-guiding plates 70 arranged in a tiled fashion. The beam travels from the lighting systems 40 to the non-luminescent display panel 60 in the same manner as with the previous embodiment. The present embodiment achieves the same effect as the previous embodiment. The present embodiment is suitable for a large screen size. The present embodiment has an advantage in that the change in the screen size of the display apparatus can be addressed by increasing or reducing the number of the light-guiding plates 70 and the lighting systems arranged in a tiled fashion.

What is claimed is:

1. A lighting system comprising:
   a heat-radiating substrate;
   an adhesive layer disposed on the heat-radiating substrate;
   lead frames disposed on the adhesive layer; and
   LEDs disposed on and connected to the lead frames so as to delimit a contact area with the lead frames;
   wherein a thermal conductivity of the adhesive layer is 1.7 W/m-K or more, and
   wherein a ratio of a contact area between the lead frames and the adhesive layer relative to the contact area between the LEDs and the lead frames is 300 or more.

2. The lighting system of claim 1, wherein the ratio of the areas is 500 or more.

3. A lighting system comprising:
   a heat-radiating substrate;
   an adhesive layer disposed on the heat-radiating substrate;
   lead frames disposed on the adhesive layer; and
   LEDs disposed on and connected to the lead frames so as to delimit a contact area with the lead frames;
   wherein a thermal conductivity of the adhesive layer is 5 W/m-K or more, and
   wherein a ratio of a contact area between the lead frames and the adhesive layer relative to the contact area between the LEDs and the lead frames is 250 or more.

4. The lighting system of claim 1, wherein
   a plurality of packages each having the LEDs, the lead frames, and a transparent sealing material are provided, and wherein
   the packages and the heat-radiating substrate are bonded together by the adhesive layer.

5. The lighting system of claim 4, wherein
   the plurality of packages are electrically connected by the lead frames.

6. A lighting system comprising a plurality of packages, wherein each of the plurality of packages includes:
a heat-radiating substrate;
an adhesive layer disposed on the heat-radiating substrate;
lead frames disposed on the adhesive layer; and
LEDs mounted on and connected to the lead frames so as to delimit a contact area with the lead frames;
wherein a thermal conductivity of the adhesive layer is 1.7 W/m-K or more and
wherein a ratio of a contact area between the lead frames and the adhesive layer relative to the contact area between the LEDs and the lead frames is 300 or more,
wherein the LEDs are connected to the lead frames by wire bonding; and
wherein an area of the lead frame on which the LED is mounted is larger than an area of the lead frame on which no LED is mounted; and
wherein the lead frame of one of the packages is electrically connected to a lead frame of an adjacent package by one of soldering, spot welding, ultrasonic welding, mechanical crimping and a wiring formed on the adhesive layer.

7. The lighting system of claim 6, wherein
the adhesive layer is made up of a rigid film with an adhesive film disposed on at least one side of the rigid film.

8. The lighting system of claim 7, wherein
the at least one of the rigid and adhesive film making up the adhesive layer has wiring that is provided between the two or more lighting systems, and wherein
the at least one of the rigid and adhesive film is shared by the two or more lighting systems as a continuous film.

9. The lighting system of claim 7, wherein
a plurality of packages each having the LEDs, the lead frames, and a transparent sealing material are provided;
wherein the rigid film has holes; and
wherein the packages exist in the holes of the rigid film.

10. The lighting system of claim 9, wherein
the lead frames of the plurality of packages or of units composed of the plurality of packages are electrically connected at the same location.

11. The lighting system of claim 10, wherein
the package has a reflector mold.

12. The lighting system of claim 11, wherein
the package contains one or more LEDs emitting a red beam, one or more LEDs emitting a blue beam, and one or more LEDs emitting a green beam.

13. The lighting system of claim 12, wherein
the package contains the LED emitting a red beam, the LED emitting a blue beam, and the two LEDs emitting a green beam, and wherein
the area of the lead frames with the LEDs emitting red and blue beams is larger than that of the lead frames with the LEDs emitting a green beam.

14. A display apparatus comprising:
a backlight having the lighting system of any one of claims 1 to 3 and 6;
a group of optical members adapted to control the uniformity and directivity of the beam from the backlight; and
a non-luminescent display panel made up of a plurality of pixels and adapted to control the reflection or transmission of a beam for each of the pixels.

15. The display apparatus of claim 14, wherein
the backlight has a light-guiding element adapted to allow the beam from the lighting system to enter the backlight from the incidence surface on the side thereof and leave the backlight from the top surface thereof.

16. The display apparatus of claim 15, wherein
the backlight has the plurality of sets of lighting system and light-guiding element, and wherein
the lighting systems and the light-guiding elements are arranged in a tiled fashion.

* * * * *